US007696050B2

(12) United States Patent
Yamaguchi et al.

(10) Patent No.: US 7,696,050 B2
(45) Date of Patent: Apr. 13, 2010

(54) METHOD OF MANUFACTURING SEMICONDUCTOR DEVICE CARRYING OUT ION IMPLANTATION BEFORE SILICIDE PROCESS (75) Inventors: Tadashi Yamaguchi, Tokyo (JP);
Keiichiro Kashihara, Tokyo (JP);
Tomonori Okudaira, Tokyo (JP);
Toshiaki Tsutsumi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 633 days.

(21) Appl. No.: 11/537,208

(22) Filed: Sep. 29, 2006

(65) Prior Publication Data
US 2007/0077736 A1 Apr. 5, 2007

(30) Foreign Application Priority Data
Oct. 4, 2005 (JP) .............................. 2005-291097

(51) Int. Cl.
H01L 21/336 (2006.01)
(52) U.S. Cl. ...................................... 438/299
(58) Field of Classification Search ................. 438/233, 438/299
See application file for complete search history.

(56) References Cited
U.S. PATENT DOCUMENTS
6,197,648 B1 3/2001 Kasai et al.

7,468,303 B2 12/2008 Sugihara
2003/0057501 A1* 3/2003 Miyanaga et al. ........... 257/390
2005/0287751 A1* 12/2005 Mehrad et al. .............. 438/303

FOREIGN PATENT DOCUMENTS
CN 1604340 A 4/2005

OTHER PUBLICATIONS
Masakatsu Tsuchiaki, et al., "Suppression of Thermally Induced Leakage of NiSi-Silicided Shallow Junctions by Pre-Silicide Fluorine Implantation", Japanese Journal of Applied Physics, vol. 44, No. 4A, 2005, pp. 1673-1681.
U.S. Appl. No. 12/510,026, filed Jul. 27, 2009, Yamaguchi, et al.

* cited by examiner

Primary Examiner—Bradley K Smith
(74) Attorney, Agent, or Firm—Oblon, Spivak, McClelland, Maier & Neustadt, L.L.P.

(57) ABSTRACT

An N-type source region and an N-type drain region of N-channel type MISFETs are implanted with ions (containing at least one of F, Si, C, Ge, Ne, Ar and Kr) with P-channel type MISFETs being covered by a mask layer. Then, each gate electrode, source region and drain region of the N- and P-channel type MISFETs are subjected to silicidation (containing at least one of Ni, Ti, Co, Pd, Pt and Er). This can suppress a drain-to-body off-leakage current (substrate leakage current) in the N-channel type MISFETs without degrading the drain-to-body off-leakage current in the P-channel type MISFETs.

6 Claims, 12 Drawing Sheets

METHOD OF MANUFACTURING SEMICONDUCTOR DEVICE CARRYING OUT ION IMPLANTATION BEFORE SILICIDE PROCESS

BACKGROUND OF THE INVENTION

1. Field of the Invention

The present invention relates to a semiconductor device and a method of manufacturing thereof which carries out ion implantation before a silicide process.

2. Description of the Background Art

A silicide process is typically carried out on respective electrodes, i.e., gate, source and drain of MISFETs (Metal Insulator Semiconductor Field Effect Transistors) formed on a semiconductor substrate, contact regions of other interconnects and the like for resistance reduction. Metal for use in such silicide process includes Co, Ni and the like.

For instance, "Suppression of Thermally Induced Leakage of NiSi-Silicided Shallow Junctions by Pre-Silicide Fluorine Implantation" (M. Tsuchiaki et al., Japanese Journal of Applied Physics, Vol. 44, No. 4A, 2005, pp. 1673-1681) reports that pre-silicide fluorine implantation into regions to be silicided achieves leakage suppression.

The above paper reports that the fluorine implantation into regions to be silicided is also effective for CMOS (Complementary MOS) fabrication, and achieves leakage suppression. Experiments conducted by the inventors of the present invention, however, have revealed that a leakage current rather increases in P-channel type MISFETs while the leakage suppression effect was indeed observed in N-channel type MISFETs.

SUMMARY OF THE INVENTION

An object of the present invention is to achieve leakage current suppression in MISFETs with more reliability.

An aspect of the present invention is directed to a method of manufacturing a semiconductor device. The method includes the steps (a) to (d). The step (a) is to form an N-channel type MISFET and a P-channel type MISFET on a semiconductor substrate, the N-channel type MISFET comprising a laminated structure of a gate insulation film and a gate electrode, an N-type source region and an N-type drain region, the P-channel type MISFET comprising a laminated structure of a gate insulation film and a gate electrode, a P-type source region and a P-type drain region. The step (b) is to form a mask layer for selectively covering the P-channel type MISFET without covering the N-channel type MISFET. The step (c) is to implant ions into at least the N-type source region and the N-type drain region of the N-channel type MISFET with the P-channel type MISFET being covered by the mask layer. The step (d) is to carry out silicidation of the gate electrode, the N-type source region and the N-type drain region implanted with the ions in the N-channel type MISFET, the gate electrode and the P-type source region and the P-type drain region in the P-channel type MISET.

Ions are implanted into the N-type source region and N-type drain region of the N-channel type MISFET with the P-channel type MISFET being covered by the mask layer. Silicidation is thereafter carried out on each gate electrode, source region and drain region of N- and P-channel type MISFETs. That is, the silicidation follows the ion implantation into the N-type source region and N-type drain region of the N-channel type MISFET without subjecting the P-type source region and P-type drain region of the P-channel type MISFET to ion implantation. This allows suppression of a drain-to-body off-leakage current (substrate leakage current) in the N-channel type MISFET without degrading the drain-to-body off-leakage current in the P-channel type MISFET. Therefore, a method of manufacturing a semiconductor device capable of suppressing a leakage current in MISFETs with more reliability can be achieved.

Another aspect of the present invention directed to a semiconductor device including a semiconductor substrate and an N-channel type MISFET formed on the semiconductor substrate. The N-channel type MISFET includes a laminated structure of a gate insulation film and a gate electrode formed on the semiconductor substrate, an N-type source region formed in a surface of the semiconductor substrate, an N-type drain region formed in the surface of the semiconductor substrate, a first sidewall insulation film formed on a side surface of the laminated structure and part of surfaces of the N-type source region and the N-type drain region, and a second sidewall insulation film formed to face the side surface of the laminated structure and part of the surfaces of the N-type source region and the N-type drain region, with the first sidewall insulation film being interposed therebetween. At least the N-type source region and the N-type drain region are implanted with ions. A height of the first sidewall insulation film from the surface of the semiconductor substrate is smaller than a height of the second sidewall insulation film from the surface of the semiconductor substrate. A maximum distance of the first sidewall insulation film from the side surface of the laminated structure is smaller than a maximum distance of the second sidewall insulation film from the side surface of the laminated structure. A difference between the maximum distance of the second sidewall insulation film and the maximum distance of the first sidewall insulation film is smaller than a difference between the height of the first sidewall insulation film and the height of the second sidewall insulation film.

At least the N-type source region and N-type drain region are implanted with ions. Therefore, silicidation of the N-type source region and N-type drain region allows suppression of a drain-to-body off-leakage current (substrate leakage current) in the N-channel type MISFET. The difference between the maximum distance of the second sidewall insulation film and the maximum distance of the first sidewall insulation film is smaller than the difference between the height of the first sidewall insulation film and the height of the second sidewall insulation film. This can achieve a semiconductor device capable of preventing silicide regions in the N-type source region and the N-type drain region from being formed close to the channel in the silicide process, which allows leakage current suppression in MISFETs with more reliability. The height of the first sidewall insulation film is smaller than the height of the second sidewall insulation film. Accordingly, silicidation causes the gate electrode to be silicided further into a region lower than the height of the second sidewall insulation film, which allows further reduction in resistance of the gate electrode.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 15:
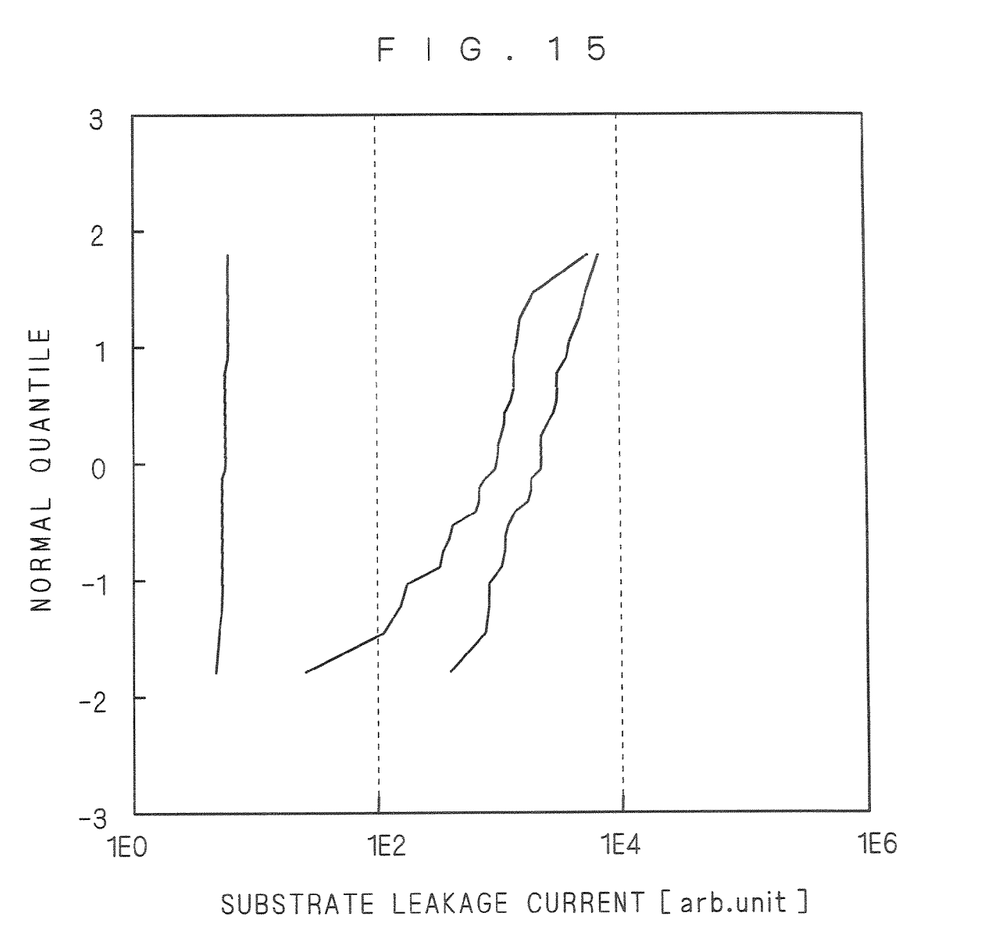
FIG. 15 shows graphs of measurements of substrate leakage current for a plurality of P-channel type MISFETs with source and drain regions being Ni silicided upon previously carrying out fluorine implantation.

FIG. 15 shows graphs of measurements of drain-to-body off-leakage current Ioffb (substrate leakage current) for a plurality of P-channel type MISFETs with source and drain regions being Ni silicided upon previously carrying out fluorine implantation.

In FIG. 15, the vertical axis indicates the quantile (value "0" is the mode) in normal distribution measurements for all P-channel type MISFETs, and the horizontal axis indicates the substrate leakage current (in arbitrary unit). The middle one of the three graphs of measurements was obtained by Ni silicidation of source and drain regions upon carrying out fluorine implantation at an energy of 5 keV and a dose of $1\times10^{15}$ cm$^{-2}$; the right one by Ni silicidation of source and drain regions upon fluorine implantation at an energy of 5 keV and a dose of $6\times10^{14}$ cm$^{-2}$; and the left one shows reference values obtained by Ni silicidation of source and drain regions without carrying out fluorine implantation.

As understood from FIG. 15, the value of drain-to-body off-leakage current (substrate leakage current) Ioffb is low in the case of Ni silicidation of source and drain regions without carrying out fluorine implantation (the leftmost one of the graphs). That is, it can be said that previous fluorine implantation into regions to be silicided brings an adverse effect against leakage current suppression for P-channel type MISFETs.

Figure 16:
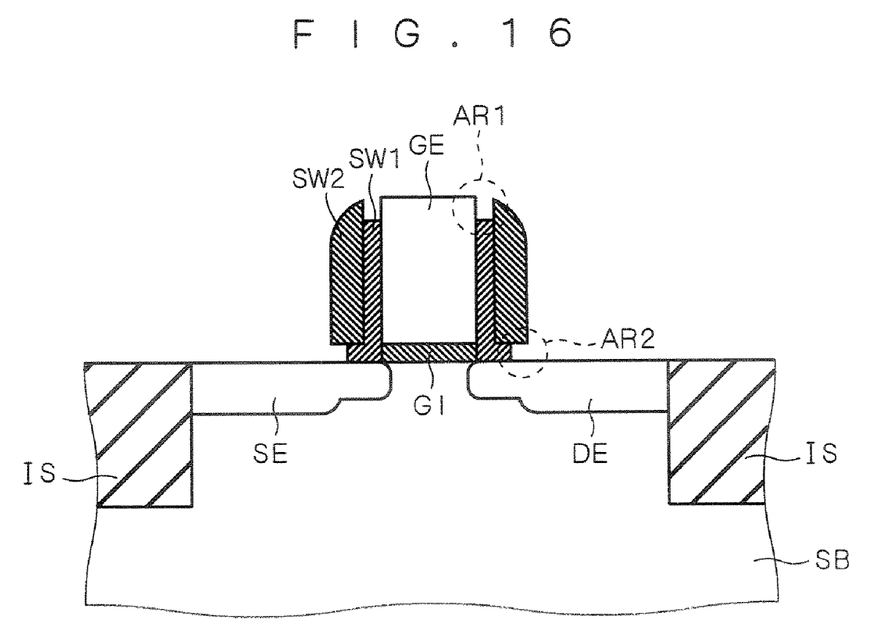
FIGS. 16 to 18 are diagrams each showing a step of manufacturing a MISFET in the case where drain-to-body off-leakage current is degraded.
Figure 17:
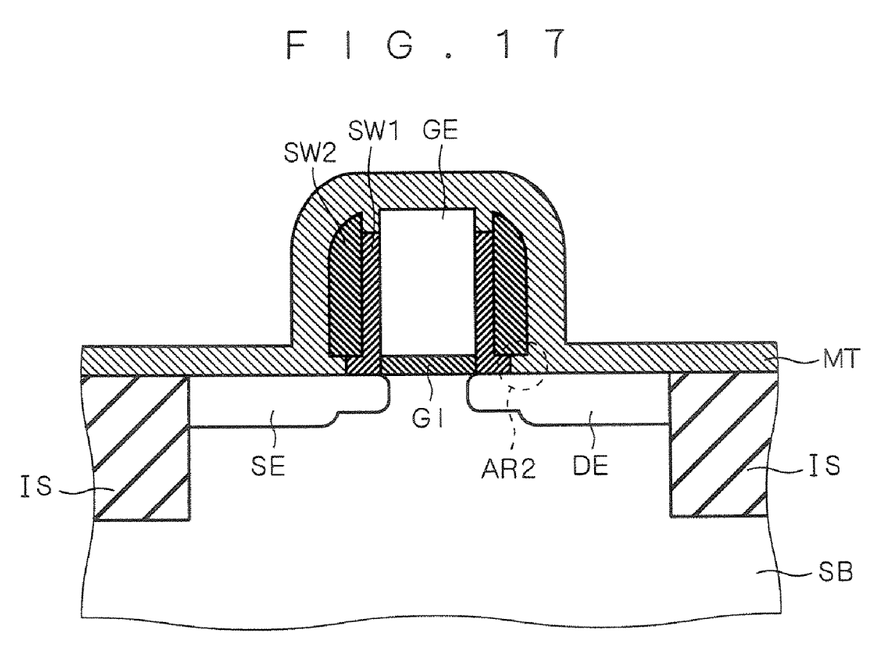
Figure 18:
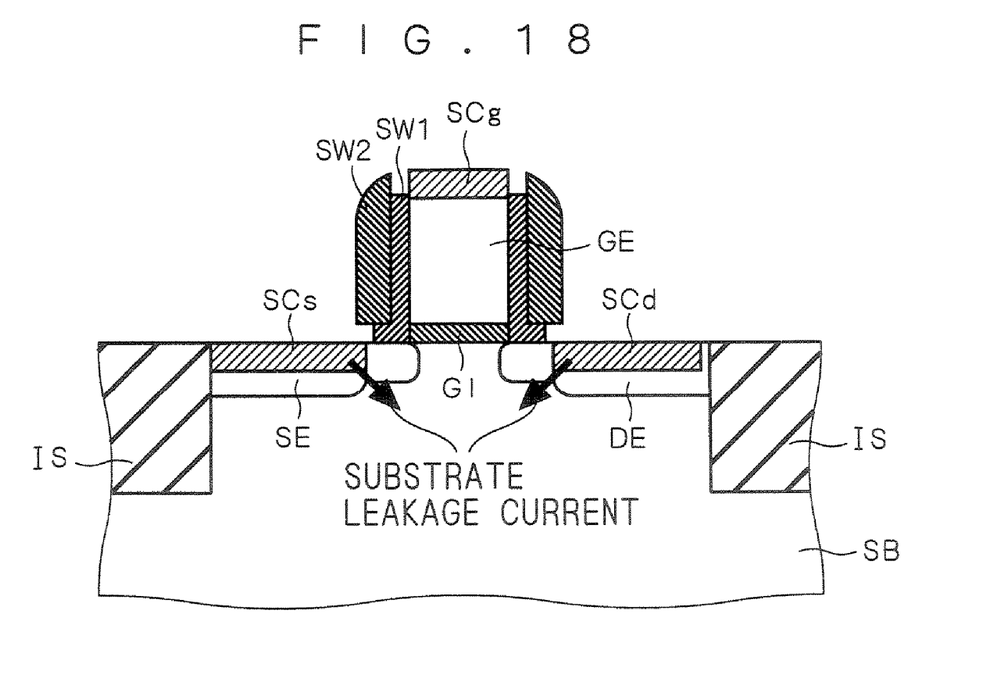

Further, even when carrying out previous fluorine implantation into regions to be silicided in N-channel type MISFETs, the drain-to-body off-leakage current (substrate leakage current) Ioffb may increase depending on the structure of MISFETs. FIGS. 16 to 18 are diagrams each showing a step of manufacturing a MISFET in the case where the drain-to-body off-leakage current Ioffb is degraded.

Sidewall insulation films SW1 and SW2 formed on a semiconductor substrate SB shown in FIG. 16 are often made of a TEOS (tetraethoxysilane) oxide film and a silicon nitride film, respectively. With this structure, cleaning the surface of a silicide region and therearound with hydrofluoric acid (light wet etching) and the like just before the silicide process causes the sidewall insulation film SW1 to be etched back, so that the sidewall insulation film SW1 is likely to be recessed at exposed parts AR1 and AR2.

Thereafter, as shown in FIG. 17, a metal film MT made of Ni or the like is formed on the entire surface, and a silicide process is carried out, which a first annealing process, removal of unreacted portion of the metal film MT and a second annealing process follow. Then, silicide regions SCs and SCd are formed as shown in FIG. 18. The metal film MT is formed into the recessed exposed part AR2 as shown in FIG. 17, which causes the silicide regions SCs and SCd to be formed close to the channel.

The drain-to-body off-leakage current Ioffb accordingly increases as the amount of etch back at the exposed part AR2 increases. Therefore, the structure shown in FIG. 18 lessens the effect of leakage current suppression even by carrying out previous fluorine implantation into regions to be silicided in N-channel type MISFETs.

A preferred embodiment of the present invention is directed to a semiconductor device and a method of manufacturing thereof which carries out ion implantation into an N-type source region and an N-type drain region of N-channel type MISFETs with P-channel type MISFETs being covered by a mask layer, and thereafter siliciding each gate electrode, source region and drain region of the N- and P-channel type MISFETs.

Figure 1:
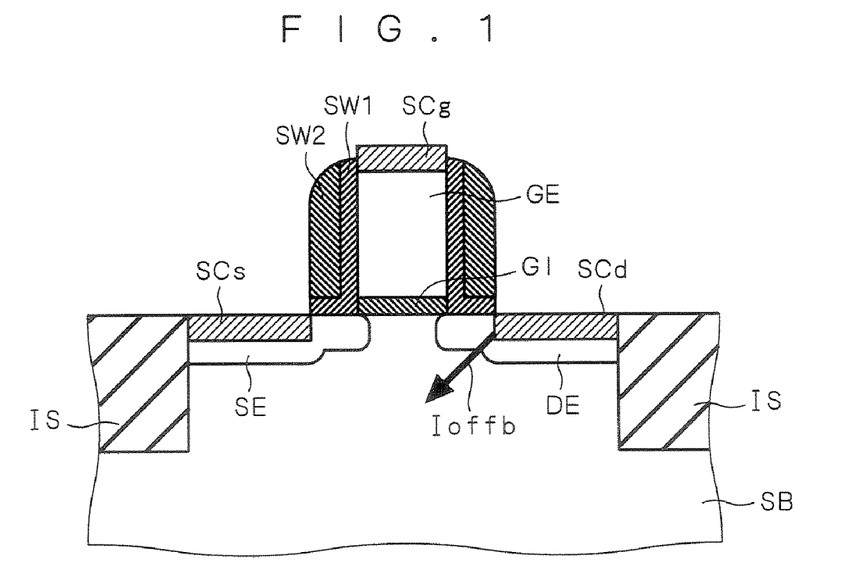
FIG. 1 is a sectional view of a semiconductor device to which the present invention is applicable.
Figure 2:
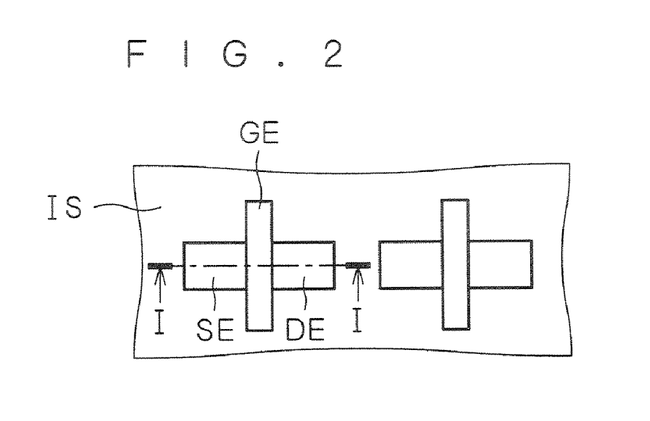
FIG. 2 is a top view of the semiconductor device to which the present invention is applicable.

FIGS. 1 and 2 are a sectional view and a top view of a semiconductor device to which the present invention is applicable, respectively. FIG. 1 is a sectional view taken along the line I-I in FIG. 2. FIG. 2 shows the semiconductor device whose respective MISFETs (Metal Insulator Semiconductor Field Effect Transistors) each having a gate electrode GE, a source region SE and a drain region DE are separated by an element isolation film IS such as a silicon oxide film.

As shown in FIG. 1, the semiconductor device includes a semiconductor substrate SB such as a silicon substrate and MISFETs formed on the semiconductor substrate SB each including a laminated structure of a gate insulation film (e.g., silicon oxide film) GI and a gate electrode (e.g., polysilicon film) GE, a source region SE and a drain region DE. The element isolation film IS is formed outside the source region SE and drain region DE.

Silicide regions SCg, SCs and SCd containing Ni (nickel), Co (cobalt) or the like are formed on the surfaces of gate electrode GE, source region SE and drain region DE, respectively. A first sidewall insulation film SW1 such as a TEOS oxide film is formed on the side surface of the laminated structure of the gate insulation film GI and gate electrode GE and part of the surfaces of the source region SE and drain region DE. A second sidewall insulation film SW2 such as a silicon nitride film is formed to face the side surface of the laminated structure of the gate insulation film GI and gate electrode GE and part of the surfaces of the source region SE and drain region DE, with the first sidewall insulation film SW1 interposed therebetween.

The semiconductor device shown in FIG. 2 has a CMOS structure, including both N- and P-channel type MISFETs. The MISFET structure shown in FIG. 1 is common to N- and P-channel type MISFETs. Both types of MISFETs have the same structure except that wells (not shown) formed in the semiconductor substrate SB, source region SE and drain region DE have different conductivity from each other. In FIG. 1, a drain-to-body off-leakage current (substrate leakage current) is denoted as Ioffb.

FIGS. 3 through 9 are diagrams each showing a step of a method of manufacturing the semiconductor device according to the preferred embodiment of the present invention. The method of manufacturing the semiconductor device will now be described with reference to these drawings.

Figure 3:
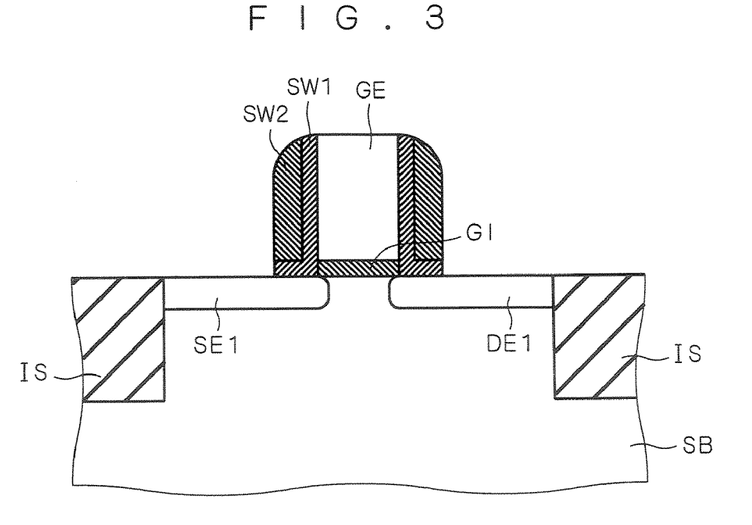
FIGS. 3 through 9 are diagrams each showing a step of a method of manufacturing a semiconductor device according to a preferred embodiment of the invention.

First, as shown in FIG. 3, P- and N-channel type MISFETs each including the laminated structure of gate insulation film GI and gate electrode GE, first sidewall insulation film SW1, second sidewall insulation film SW2, LDD (Lightly Doped Drain) region SE1 serving as a source region and LDD region DE1 serving as a drain region are each formed on the semiconductor substrate SB by photolithography, etching, ion implantation technique or the like.

Figure 4:
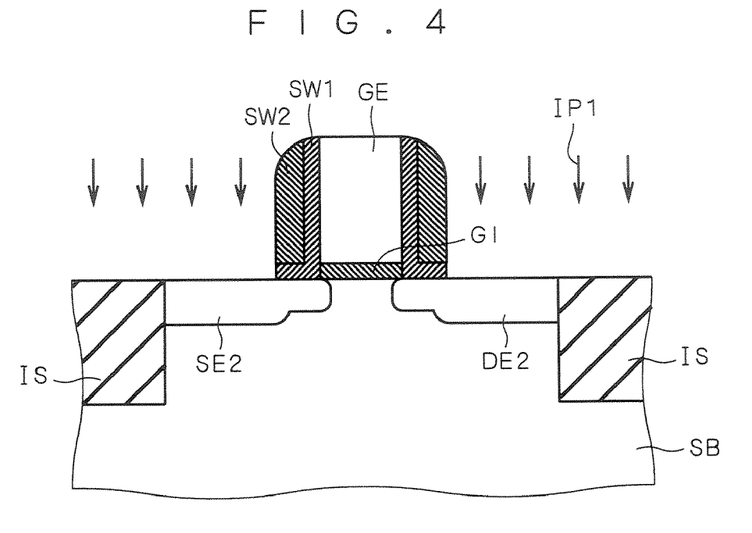

Next, as shown in FIG. 4, ion implantation IP1 is carried out to form a source region SE2 and a drain region DE2. For forming the N-type source region and N-type drain region, the semiconductor substrate SB may be implanted with e.g., As (arsenic) ions at an energy of 5 to 50 keV and a dose of $1\times10^{15}$ to $1\times10^{16}$ cm$^{-2}$. For forming the P-type source region and P-type drain region, the semiconductor substrate SB may be implanted with e.g., B (boron) ions at an energy of 1 to 5 keV and a dose of $1\times10^{15}$ to $1\times10^{16}$ cm$^{-2}$. As a matter of course, since the semiconductor device according to the present invention has a CMOS structure, ion implantation for forming the source and drain of the N-channel type MISFETs and ion implantation for forming the source and drain of the P-channel type MISFETs may be selectively performed by using photoresist as a mask.

Figure 5:
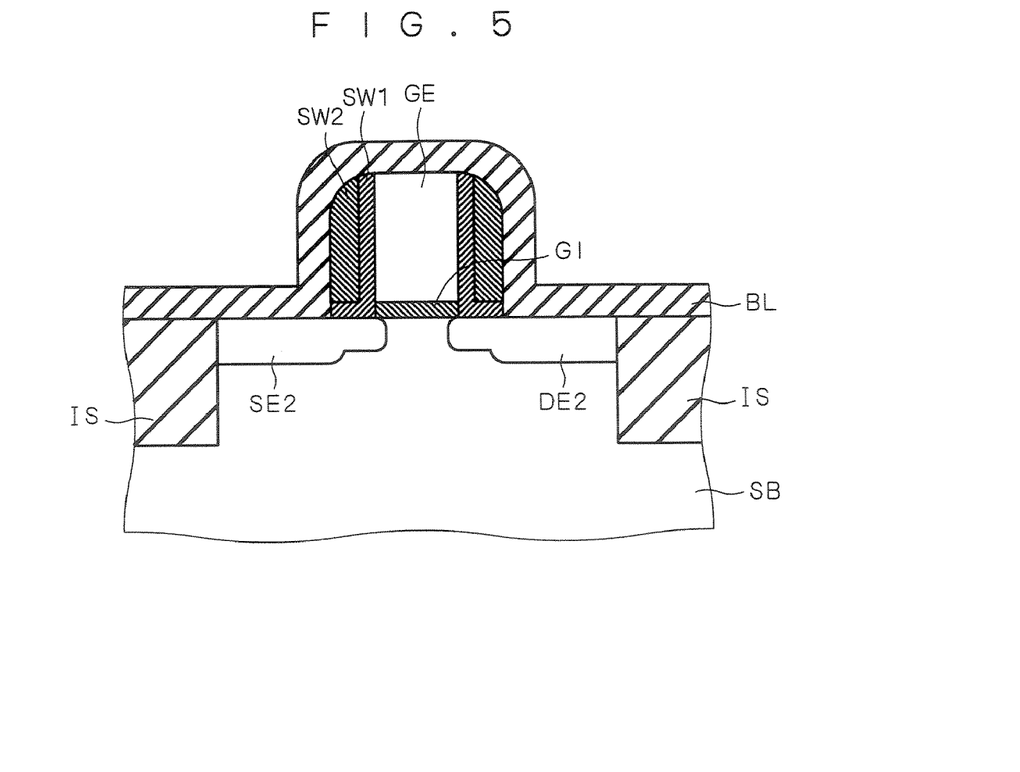

Next, as shown in FIG. 5, a silicidation stop film BL for covering part of the semiconductor substrate SB not to be silicided is formed to cover the surfaces of the P-channel type MISFET, N-channel type MISFET and semiconductor substrate SB. As this silicidation stop film BL, a USG (Undoped Silicate Glass) film deposited at a deposition temperature of 400° C. by CVD (Chemical Vapor Deposition) technique may be adopted.

Figure 6:
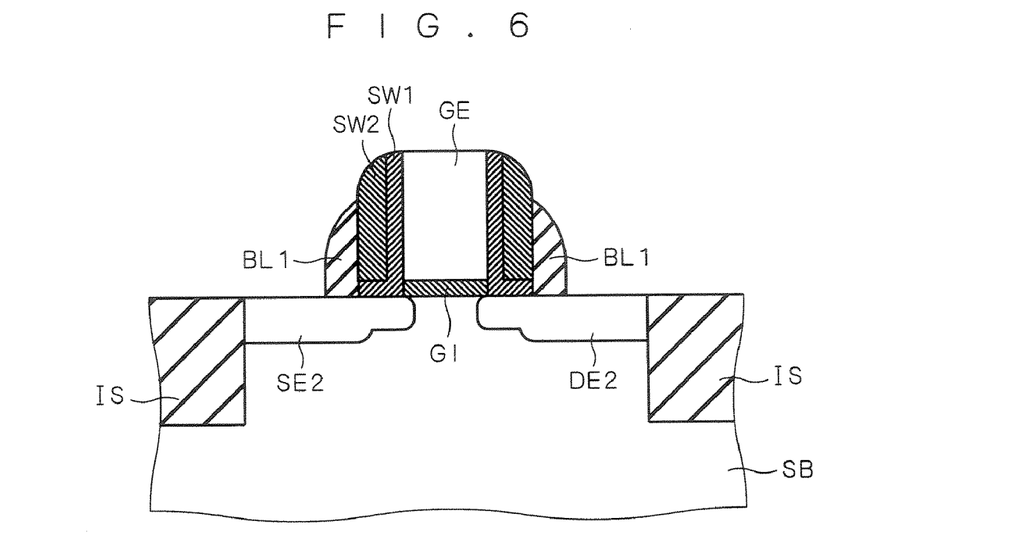

Then, the silicidation stop film BL is subjected to selective anisotropic etching (dry etching) with photolithography and etching techniques, so that a silicidation stop film BL1 remains on regions not to be silicided (e.g., part of contact regions of interconnects that is not to be silicided (not shown)), on the side of the laminated structure of gate insulation film GI and gate electrode GE of the P-channel type MISFET and on the side of the laminated structure of gate insulation film GI and gate electrode GE of the N-channel type MISFET (FIG. 6).

Figure 7:
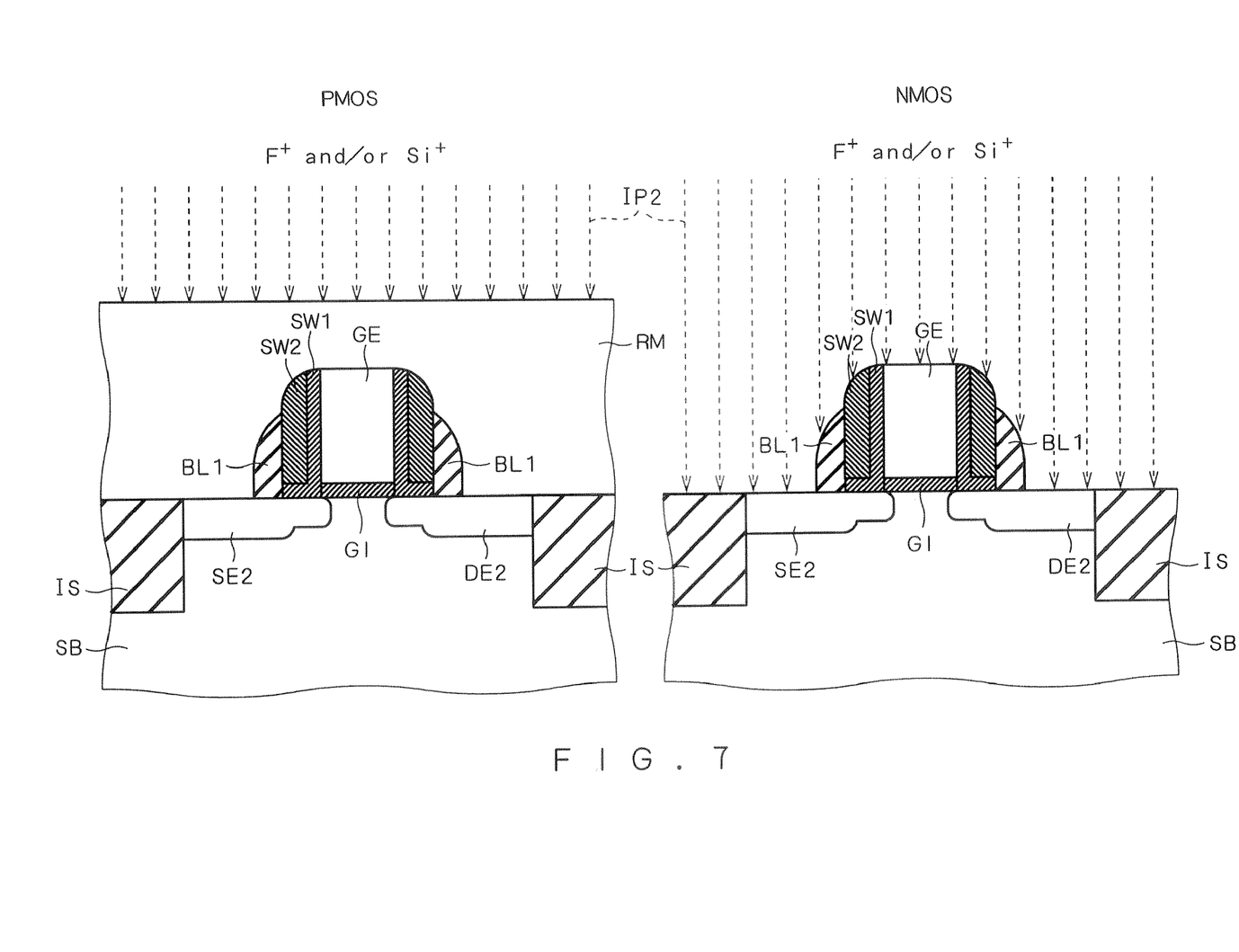

Next, as shown in FIG. 7, a mask layer RM is formed to selectively cover the P-channel type MISFET without covering the N-channel type MISFET. Photoresist may be adopted as the mask layer RM and may be patterned. Implantation IP2 with fluorine ions (indicated by "F+") and/or silicon ions (indicated by "Si+") is carried out into at least the N-type source region and N-type drain region of the N-channel type MISFET with the P-channel type MISFET being covered by the mask layer RM. The ion implantation IP2 may be carried out at an energy of 5 keV and a dose of $6\times10^{14}$ to $1\times10^{15}$ cm$^{-2}$ in either case of fluorine ions and silicon ions.

Further, fluorine ions and silicon ions are only an illustrative example, and the ion implantation IP2 may be carried out with ions at least containing one of F (fluorine), Si (silicon), C (carbon), Ge (germanium), Ne (neon), Ar (argon) and Kr (krypton).

Next, regions to be silicided are cleaned so as to remove the silicon oxide films generated on the surfaces of the semiconductor substrate SB and gate electrode GE. In this cleaning step, cleaning with hydrofluoric acid may be conducted in addition to RCA cleaning. Alternatively, this cleaning may be pre-cleaning by a device integrally provided with a pre-cleaning (chemical dry cleaning) device and a sputtering device.

At this time, the remaining silicidation stop films BL1 and the regions to be silicided are cleaned. With this cleaning step, the silicidation stop film BL1 remaining on the side of the laminated structure of gate insulation film GI and gate electrode GE of the P-channel type MISFET and the silicidation stop film BL1 remaining on the side of the laminated structure of gate insulation film GI and gate electrode GE of the N-channel type MISFET are removed, while the silicidation stop films BL1 formed on the other parts (not shown) are not completely removed with this cleaning and remain as-is.

Figure 8:
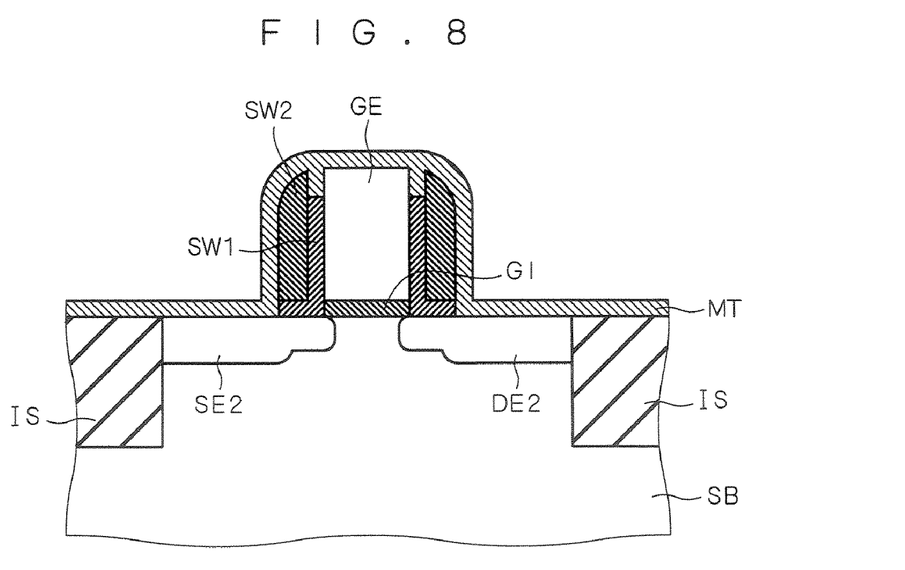
Figure 9:
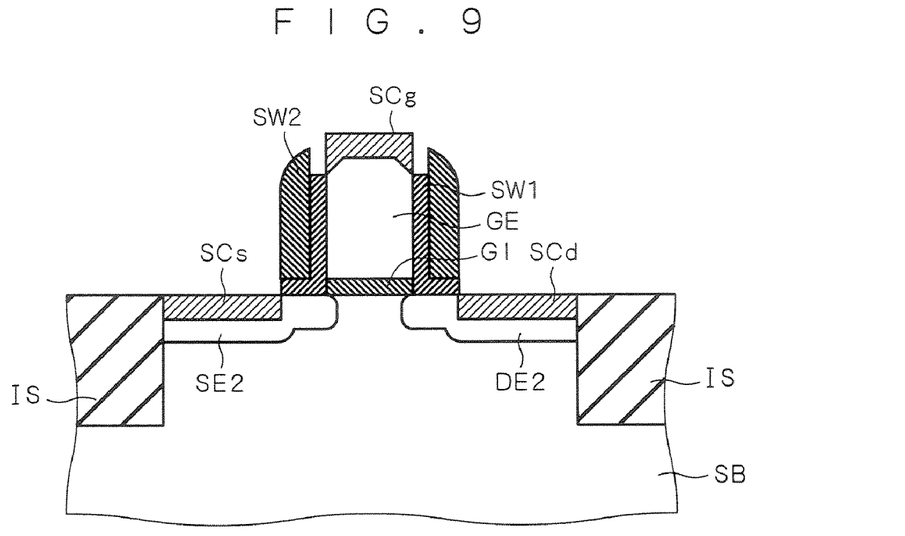

Next, the metal film MT made of Ni or the like is formed by sputtering or the like on the surfaces of the N-channel type MISFET, P-channel type MISFET, semiconductor substrate SB and the remaining parts of the silicidation stop film BL1, as shown in FIG. 8. Then, first RTA (Rapid Thermal Annealing) is carried out, and an unreacted portion of the metal film MT is removed, which second RTA follows. The gate electrode, N-type source and drain regions of the N-channel type MISFET, and, the gate electrode, P-type source and drain regions of the P-type channel MISFET are silicided, respectively, so that the silicide regions SCg, SCs and SCd are formed on the surfaces of gate electrode GE, source region SE and drain region DE, respectively, as shown in FIG. 9.

The material for the metal film MT is not limited to Ni, but a metal film containing at least one of Ni, Ti (titanium), Co (cobalt), Pd (palladium), Pt (platinum) and Er (erbium) may be adopted.

The aforementioned paper by M. Tsuchiaki et al. reports that pre-silicide fluorine implantation into regions to be silicided allows leakage current suppression, however, the inventors of the present invention have found out that fluorine is only an illustrative example and that leakage current suppression can be achieved by implanting ions containing at least one of F, Si, C, Ge, Ne, Ar and Kr into the N-type source region and N-type drain region of N-channel type MISFETs.

Figure 10:
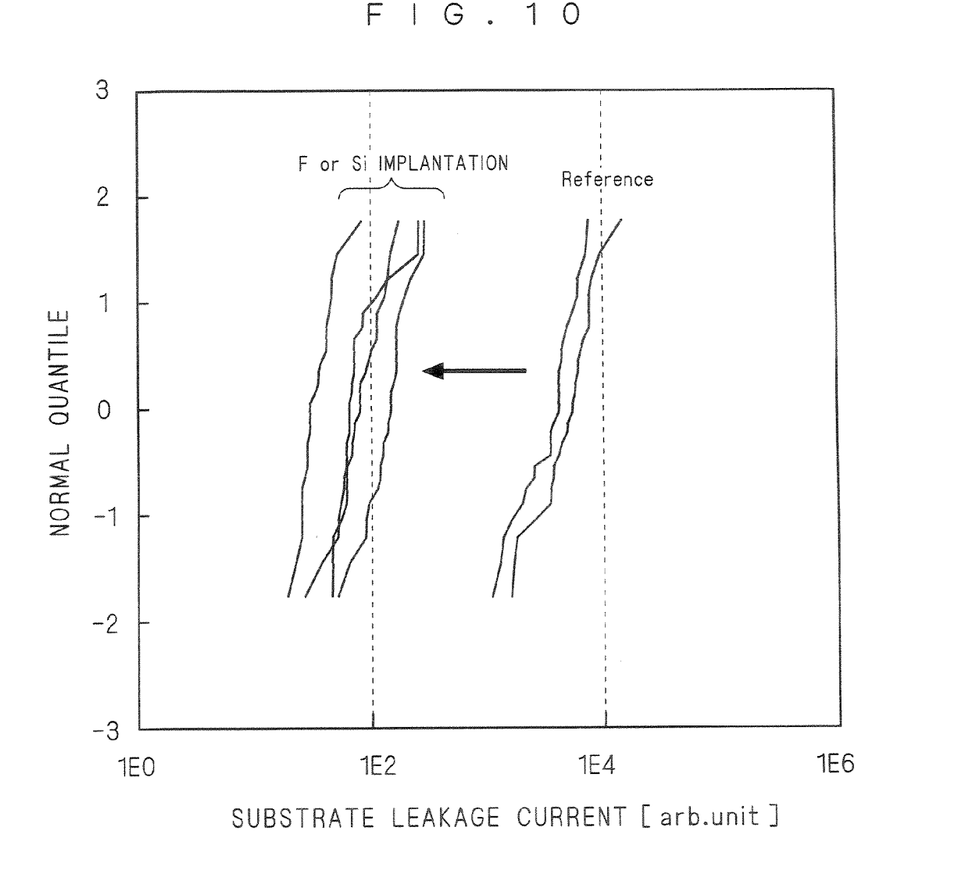
FIG. 10 shows graphs of measurements of substrate leakage current for a plurality of N-channel type MISFETs with source and drain regions being Ni silicided upon previously carrying out fluorine implantation or silicon implantation.

FIG. 10 shows graphs of measurements of drain-to-body off-leakage current Ioffb (substrate leakage current) Ioffb in a plurality of N-channel type MISFETs with the N-type source region and N-type drain region being Ni silicided upon previously carrying out fluorine implantation or silicon implantation.

In FIG. 10, the vertical axis indicates the quantile (value "0" is the mode) in normal distribution measurements for all N-channel type MISFETs, and the horizontal axis indicates the substrate leakage current (in arbitrary unit). The graphs indicated as "F, Si implantation" were obtained by: Ni silicidation of N-type source region and N-type drain region upon carrying out fluorine implantation at an energy of 5 keV and a dose of $1\times10^{15}$ cm$^{-2}$; Ni silicidation of N-type source region and N-type drain region upon fluorine implantation at an energy of 5 keV and a dose of $6\times10^{14}$ cm$^{-2}$; Ni silicidation of N-type source region and N-type drain region upon silicon implantation at an energy of 5 keV and a dose of $1\times10^{15}$ cm$^{-2}$; Ni silicidation of N-type source region and N-type drain region upon silicon implantation at an energy of 5 keV and a dose of $6\times10^{14}$ cm$^{-2}$. The graph indicated as "Reference" was obtained by Ni silicidation of N-type source region and N-type drain region without carrying out fluorine implantation.

As understood from FIG. 10, the value of drain-to-body off-leakage current (substrate leakage current) Ioffb is lower in the case of Ni silicidation of the N-type source region and N-type drain region upon fluorine or silicon implantation than in the case of Ni silicidation of N-type source region and N-type drain region without carrying out fluorine implantation (indicated as "Reference").

In contrast, according to the present invention, the mask layer RM is formed on P-channel type MISFETs in which previous fluorine implantation into regions to be silicided brings an adverse effect against leakage current suppression. Accordingly, the regions to be silicided are not previously implanted with fluorine, silicon or the like.

That is, according to the present invention, the N-type source region and N-type drain region of N-channel type MISFETs are implanted with ions with P-channel type MISFETs being covered by the mask layer RM. Then, each gate electrode, source region and drain region of the N- and P-channel type MISFETs are silicided. In other words, the present invention allows silicidation after implanting the N-type source region and N-type drain region of the N-channel type MISFETs with ions without implanting the P-type source region and P-type drain region of the P-channel type MISFETs with ions. This allows the drain-to-body off-leakage current (substrate leakage current) Ioffb to be suppressed in the N-channel type MISFETs without degrading the drain-to-body off-leakage current Ioffb in the P-channel type MISFETs. Accordingly, the present invention can achieve a method of manufacturing a semiconductor device capable of suppressing a leakage current in MISFETs with more reliability.

Further, according to the present invention, the silicidation stop films BL1 remain on the side of the laminated structure of gate insulation film GI and gate electrode GE of P-channel type MISFETs and on the side of the laminated structure of gate insulation film GI and gate electrode GE of N-channel type MISFETs, respectively, and the remaining silicidation stop films BL1 and the regions to be silicided are cleaned. With the silicidation stop films BL1 each remaining on the side of the laminated structure of gate insulation film GI and gate electrode GE, portions of the sidewall insulation films SW1 and SW2 adjacent to the laminated structure of gate insulation film GI and gate electrode GE of N-channel type MISFETs and the laminated structure of gate insulation film GI and gate electrode GE of P-channel type MISFETs are less likely to be etched back when cleaning the regions to be silicided. Accordingly, the present invention can achieve a method of manufacturing a semiconductor device capable of preventing silicide regions in each source region and drain region of N- and P-channel type MISFETs from being formed close to the channel, which allows leakage current suppression in MISFETs with more reliability.

Figure 11:
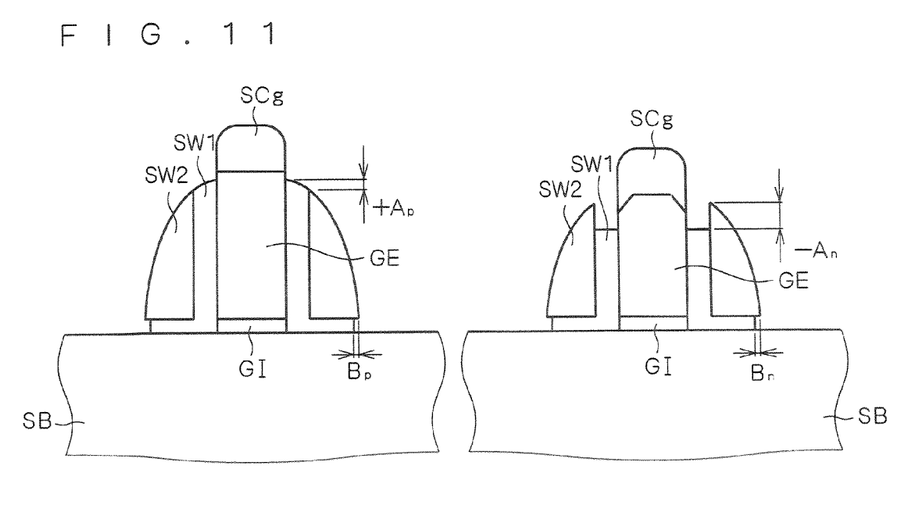
FIG. 11 is a sectional view showing the structure of the semiconductor device according to the invention after cleaning.

FIG. 11 is a sectional view showing the structure of the semiconductor device according to the invention after cleaning. In FIG. 11, the right one is an N-channel type MISFET, and the left one is a P-channel type MISFET. In the N-channel type MISFET shown in FIG. 11, the height of the first sidewall insulation film SW1 from the surface of the semiconductor substrate SB is smaller than that of the second sidewall insulation film SW2 from the semiconductor substrate SB. Further, in the N-channel type MISFET, the maximum distance of the first sidewall insulation film SW1 from the side surface of the laminated structure of gate insulation film GI and gate electrode GE is smaller than that of the second sidewall insulation film SW2 from the side surface of the laminated structure of gate insulation film GI and gate electrode GE. A difference Bn between the maximum distance of the second sidewall insulation film SW2 from the side surface of the gate and that of the first sidewall insulation film SW1 from the side surface of the gate is smaller than a difference An between the height of the first sidewall insulation film SW1 and that of the second sidewall insulation film SW2.

Figure 12:
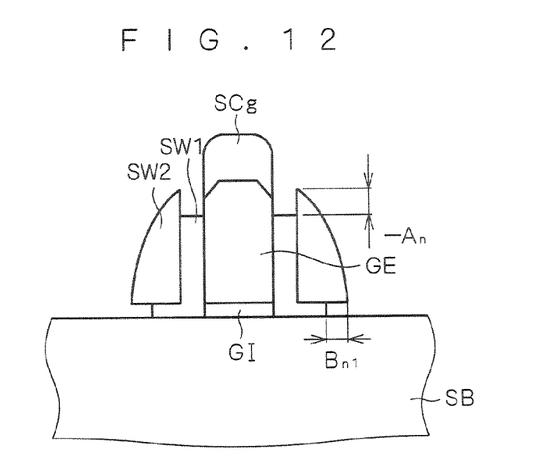
FIG. 12 is a sectional view showing the structure of the semiconductor device after cleaning without carrying out ion implantation.

FIG. 12 is a sectional view showing the structure of the N-channel type MISFET after cleaning in the case of not carrying out ion implantation. In FIG. 12, a difference Bn1 between the maximum distance of the second sidewall insulation film SW2 from the side surface of the gate and that of the first sidewall insulation film SW1 from the side surface of the gate is nearly equal to a difference An1 between the height of the first sidewall insulation film SW1 and that of the second sidewall insulation film SW2.

The inventors of the present invention consider the difference in size of difference Bn in FIG. 11 and difference Bn1 in FIG. 12 as follows:

That is, in FIG. 11 where ion implantation with fluorine, silicon or the like is carried out, a relatively large amount of ions is implanted into the top of part of the first sidewall insulation film SW1 in contact with the side surface of the gate electrode GE. Over the edge of the part of the first sidewall insulation film SW1 in contact with the source region SE and drain region DE, the second sidewall insulation film SW2 exists, and the silicidation stop film BL1 remains on the side thereof.

This means that, according to the present invention, a relatively larger amount of ions is implanted into the top of part of the first sidewall insulation film SW1 in contact with the side surface of the gate electrode GE than into the edge of the first sidewall insulation film SW1 in contact with the source region SE and drain region DE.

Figure 13:
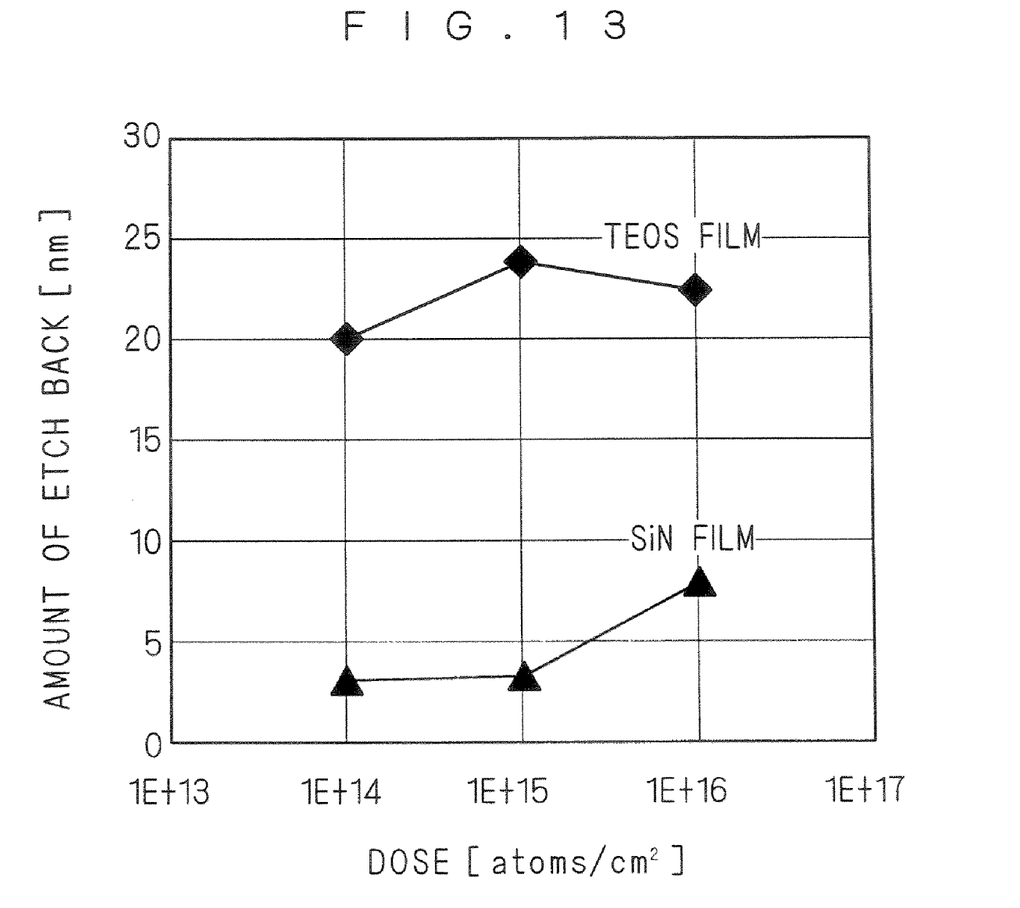
FIG. 13 is a graph showing the relationship between doses of fluorine ions or silicon ions and the amount of etch back of TEOS oxide film and silicon nitride film at cleaning.

As shown in the graph of FIG. 13, it has been confirmed that both the TEOS oxide film constituting the first sidewall insulation film SW1 and silicon nitride film constituting the second sidewall insulation film SW2 are etched back in a larger amount in the cleaning just before the silicide process as the dose of ion implantation increases.

Accordingly, carrying out ion implantation into the N-channel type MISFETs, and then cleaning and performing the silicide process by the method of manufacturing the semiconductor device according to the present invention, the top of part of the first sidewall insulation film SW1 in contact with the side surface of the gate electrode GE is etched back in a relatively larger amount while the edge of the first sidewall insulation film SW1 in contact with the source region SE and drain region DE is etched back in a relatively smaller amount. This is considered as the reason why the difference Bn between the maximum distance of the second sidewall insulation film SW2 from the side surface of the gate and that of the first sidewall insulation film SW1 from the side surface of the gate is smaller than the difference An between the height of the first sidewall insulation film SW1 and that of the second sidewall insulation film SW2.

In the case of not carrying out ion implantation, there is no difference between the amount of etch back of the top of part of the first sidewall insulation film SW1 in contact with the side surface of the gate electrode GE and the amount of etch back of the edge of the first sidewall insulation film SW1 in contact with the source region SE and drain region DE. This is considered as the reason why the difference Bn1 between the maximum distance of the second sidewall insulation film SW2 from the side surface of the gate and that of the first sidewall insulation film SW1 from the side surface of the gate is nearly equal to the difference An1 between the height of the first sidewall insulation film SW1 and that of the second sidewall insulation film SW2.

Figure 14:
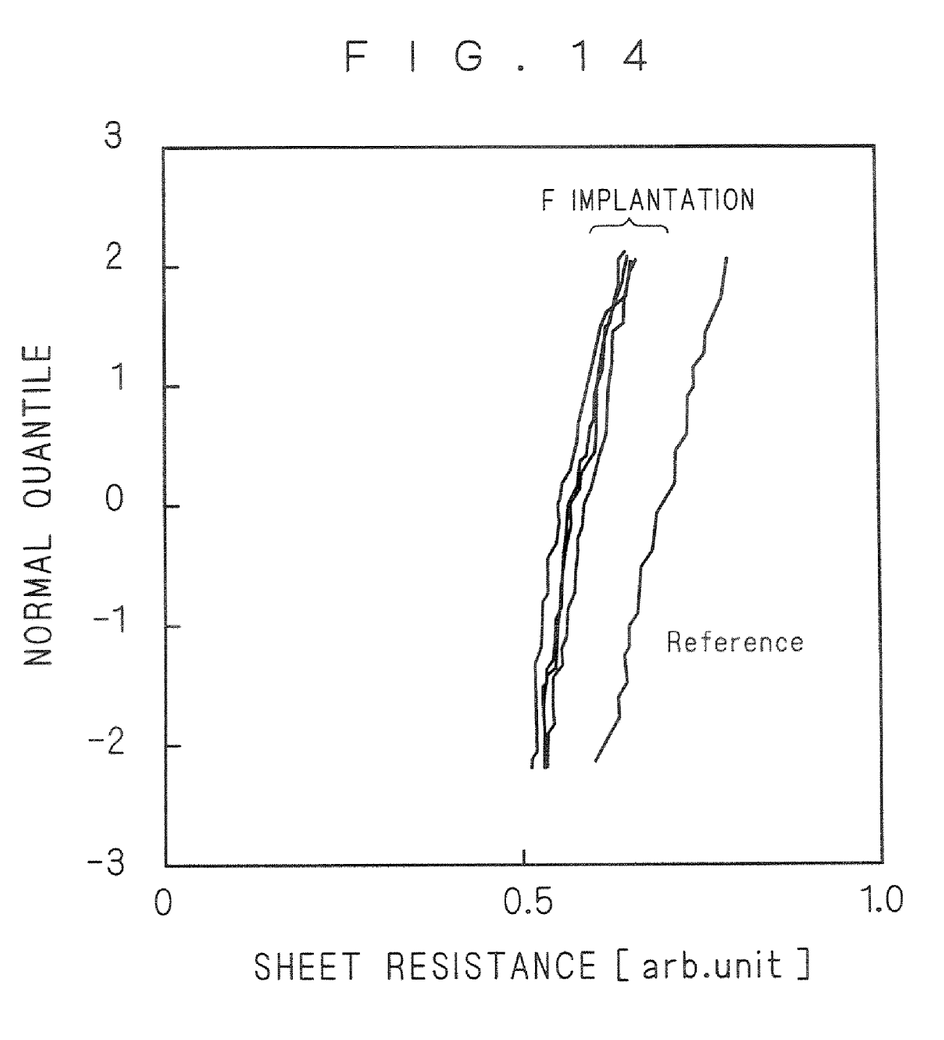
FIG. 14 shows graphs of measurements of sheet resistance of gate electrode for a plurality of N-channel type MISFETs silicided upon previously carrying out fluorine implantation.

FIG. 14 shows graphs of measurements of sheet resistance of gate electrode GE for a plurality of N-channel type MISFETs silicided upon previously carrying out fluorine implantation. In FIG. 14, the vertical axis indicates the quantile (value "0" is the mode) in normal distribution measurements for all N-channel type MISFETs, and the horizontal axis indicates the sheet resistance (in arbitrary unit). The graphs indicated as "F implantation" were obtained by Ni silicidation of gate electrode GE upon carrying out fluorine implantation at an energy of 5 keV and a dose of $1 \times 10^{15}$ cm$^{-2}$, and Ni silicidation of gate electrode GE upon fluorine implantation at an energy of 5 keV and a dose of $6 \times 10^{14}$ cm$^{-2}$. The graph indicated as "Reference" shows reference values obtained by Ni silicidation of gate electrode GE without carrying out fluorine implantation. It is apparent that the sheet resistance is lower in N-channel type MISFETs with the gate electrode GE silicided upon carrying out previous fluorine implantation.

Since the P-channel type MISFETs are not subjected to ion implantation, the amount of etch back of the top of the first sidewall insulation film SW1 of the P-channel type MISFETs is significantly smaller than that of the top of the first sidewall insulation film SW1 of the N-channel type MISFETs in the cleaning just before the silicide process. In the left structure shown in FIG. 11, the height of the first sidewall insulation film SW1 of the P-channel type MISFET is larger than the height of the second sidewall insulation film SW2, and a difference therebetween is denoted as Ap.

In the P-channel type MISFET, similarly to the N-channel type MISFET, the maximum distance of the first sidewall insulation film SW1 from the side surface of the laminated structure of gate insulation film GI and gate electrode GE is smaller than that of the second sidewall insulation film SW2 from the side surface of the laminated structure, however, a difference Bp between the maximum distance of the second sidewall insulation film SW2 from the side surface of the gate and that of the first sidewall insulation film SW1 from the side surface of the gate in the P-channel type MISFET is almost equal to the difference Bn between the maximum distance of the second sidewall insulation film SW2 from the side surface of the gate and that of the first sidewall insulation film SW1 from the side surface of the gate in the N-channel type MISFET.

As described, with the structure of the semiconductor device according to the present invention, the difference Bn between the maximum distance of the second sidewall insulation film SW2 from the side surface of the gate and that of the first sidewall insulation film SW1 from the side surface of the gate in the N-channel type MISFETs is smaller than the difference An between the height of the first sidewall insulation film SW1 and that of the second sidewall insulation film SW2. Accordingly, the present invention can achieve a method of manufacturing a semiconductor device capable of preventing silicide regions in the N-type source region and N-type drain region from being formed close to the channel in the silicide process, which allows leakage current suppression in MISFETs with more reliability. Further, the height of the first sidewall insulation film SW1 is smaller than that of the second sidewall insulation film SW2. Accordingly, silicidation causes the gate electrode GE to be silicided further into a region lower than the height of the second sidewall insulation film SW2, which allows further reduction in resistance of the gate electrode GE.

Further, according to the present invention, the difference Bp between the maximum distance of the second sidewall insulation film SW2 from the side surface of the gate and that of the first sidewall insulation film SW1 from the side surface of the gate in the P-channel type MISFETs is almost equal to the difference Bn between the maximum distance of the second sidewall insulation film SW2 from the side surface of the gate and that of the first sidewall insulation film SW1 from the side surface of the gate in the N-channel type MISFETs. Accordingly, in the silicide process, silicide regions in the P-type source and P-type drain region are less likely to be formed close to the channel, which can achieve a semiconductor device capable of suppressing a leakage current in MISFETs with more reliability.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) forming an N-channel type MISFET and a P-channel type MISFET on a semiconductor substrate, said N-channel type MISFET comprising a laminated structure of a first gate insulation film and a first gate electrode, a first sidewall at a side surface of said first gate electrode of the N-channel type MISFET, first and second lightly doped drain (LDD) regions sandwiching a region of said semiconductor substrate which is under said first gate insulation film of the N-channel type MISFET, said P-channel type MISFET comprising a laminated structure of a second gate insulation film and a second gate electrode, a second sidewall at a side surface of said second gate electrode of the P-channel type MISFET, third and fourth LDD regions sandwiching a region of said semiconductor substrate which is under said second gate insulation film of the P-channel type MISFET;
   (b) after step (a), forming a P-type source region and a P-type drain region in said P-channel type MISFET;
   (c) after step (a), forming an N-type source region and an N-type drain region in said N-channel type MISFET;
   (d) after steps (b) and (c), forming a mask layer for selectively covering said P-channel type MISFET without covering said N-channel type MISFET;
   (e) after step (d), implanting ions into said N-type source region and said N-type drain region of said N-channel type MISFET with said P-channel type MISFET being covered by said mask layer; and
   (f) after step (e), carrying out silicidation of said gate electrode of the N-channel type MISFET, said N-type source region and said N-type drain region implanted with said ions in said N-channel type MISFET, said second gate electrode of the P-channel type MISFET and said P-type source region and said P-type drain region in said P-channel type MISFET.

2. The method according to claim 1, further comprising the steps of:
   (g) prior to said step (f), forming a silicidation stop film for covering part of said semiconductor substrate to be prevented from being silicided in said silicidation so as to cover surfaces of said P-channel type MISFET, said N-channel type MISFET and said semiconductor substrate;
   (h) carrying out selective anisotropic etching on said silicidation stop film, so that parts of said silicidation stop film remain on said part to be prevented from being silicided, side of said laminated structure of said P-channel type MISFET and side of said laminated structure of said N-channel type MISFET; and
   (i) prior to said step (f), cleaning said remaining parts of said silicidation stop film and part to be subjected to said silicidation.

3. The method according to claim 1, wherein said ions implanted in said step (e) are carbon, germanium, neon, argon or krypton.

4. The method according to claim 1, wherein said silicidation in step (f) is carried out using a metal film comprising at least one of nickel, titanium, cobalt, palladium, platinum and erbium.

5. The method according to claim 1, wherein said ions implanted in said step (e) are fluorine.

6. The method according to claim 1, wherein said ions implanted in said step (e) are silicon.

* * * * *